United States Patent [19]

Yaron et al.

[11] 4,341,569
[45] Jul. 27, 1982

[54] SEMICONDUCTOR ON INSULATOR LASER PROCESS

[75] Inventors: Giora Yaron; Eliyahou Harari, both of Irvine; Samuel T. Wang, Mission Viejo; LaVerne D. Hess, Thousand Oaks, all of Calif.

[73] Assignee: Hughes Aircraft Company, Culver City, Calif.

[21] Appl. No.: 166,881

[22] Filed: Jul. 8, 1980

Related U.S. Application Data

[63] Continuation of Ser. No. 60,081, Jul. 24, 1979, abandoned.

[51] Int. Cl.³ .................... H01L 21/263; B05D 3/06
[52] U.S. Cl. .................................. 148/1.5; 148/187; 219/121 LE; 219/121 LF; 357/91; 427/43.1
[58] Field of Search .............. 148/1.5, 187; 357/23, 357/91; 219/121 LH, 121 LE, 121 LF; 427/43.1

[56] References Cited

U.S. PATENT DOCUMENTS

| | | | |
|---|---|---|---|
| 3,303,319 | 2/1967 | Steigerwald | 219/121 |
| 3,369,101 | 2/1968 | DiCurio | 219/121 |
| 3,585,088 | 6/1971 | Schwuttke | 148/174 |
| 3,814,829 | 6/1974 | Movchan et al. | 13/31 |
| 3,867,217 | 2/1975 | Maggs et al. | 156/3 |
| 4,059,461 | 11/1977 | Fan et al. | 148/1.5 |
| 4,126,500 | 11/1978 | Pacanos | 156/154 |
| 4,199,384 | 4/1980 | Hsu | 148/1.5 |
| 4,214,918 | 7/1980 | Gat et al. | 357/91 |
| 4,217,153 | 8/1980 | Fukunaga et al. | 148/1.5 |
| 4,229,232 | 10/1980 | Kirkpatrick | 148/1.5 |
| 4,230,791 | 10/1980 | Chu et al. | 148/1.5 |
| 4,249,960 | 2/1981 | Schnable et al. | 148/1.5 |
| 4,252,574 | 2/1981 | Fabula | 148/1.5 |
| 4,258,078 | 3/1980 | Celler et al. | 219/121 LF |
| 4,272,880 | 6/1981 | Pashley | 148/1.5 |

OTHER PUBLICATIONS

Yaron et al., 1979 I.E.E.E. Device Research Conf. at Boulder, Colo., Jun. 24-27, 1979.
Bean et al., J. Appl. Phys. 50 (1979), 881.
Cook et al., Appl. Phys. Letts. 26 (1975), 124.
Bomke et al., Appl. Phys. Letts. 33 (1978), 955.

*Primary Examiner*—Upendra Roy
*Attorney, Agent, or Firm*—Robert M. Wallace; W. H. MacAllister

[57] ABSTRACT

A beam of radiant energy such as a laser beam is applied to an epitaxial silicon island on a silicon on sapphire device before formation of overlying layers of oxide and metal. The energy beam changes the crystal structure of the epitaxial silicon island to increase the mobility of carriers in the silicon island, improving the speed of transistors formed on the silicon island. The energy beam also causes the material in the silicon island edge to reflow, causing a reduction in the slope of the edge face of the silicon island edge, and a smoothing of the surface of the face, resulting in improved aluminum step coverage and elimination of a V-shaped groove in the first insulation layer at the bottom corner edge of the island, thereby increasing processing yield.

31 Claims, 8 Drawing Figures

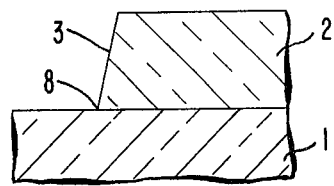
Fig. 1.
Fig. 2.
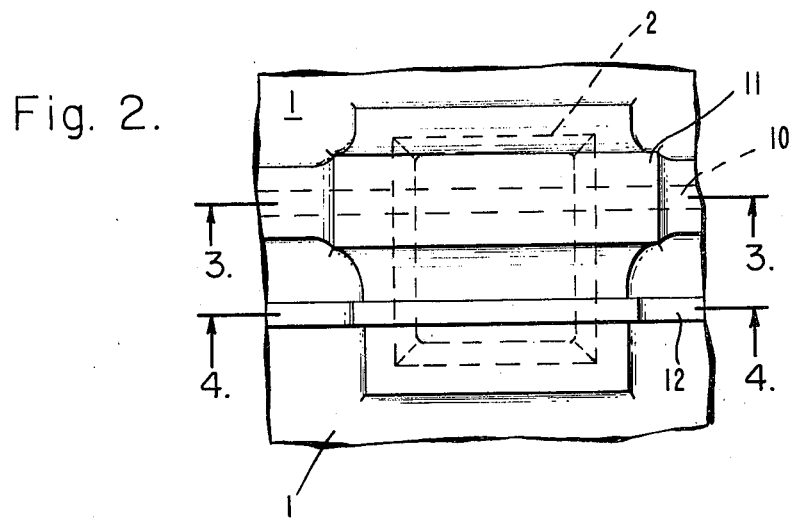
Fig. 3.
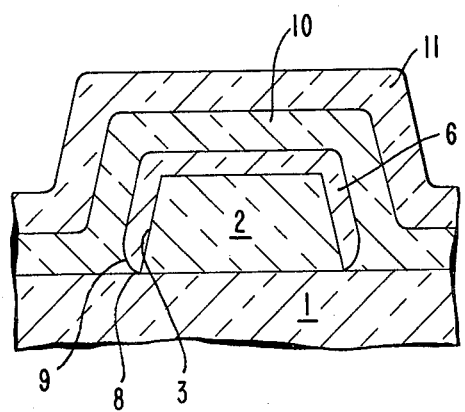
Fig. 4.
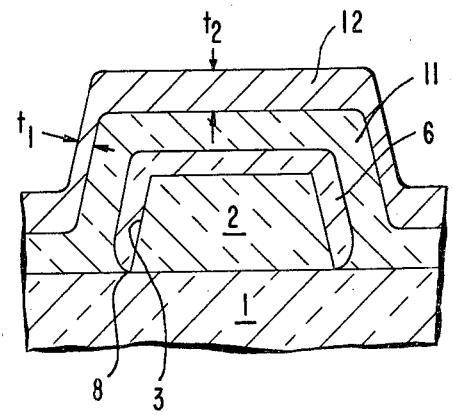

SEMICONDUCTOR ON INSULATOR LASER PROCESS

This is a continuation of application Ser. No. 060,081, filed July 24, 1979, now abandoned.

TECHNICAL FIELD

This invention is related to metal oxide semiconductor devices formed in a semiconductor such as silicon on an insulator such as sapphire in which the channel mobility is increased and the edge of the semiconductor island is improved by application of an energy beam.

BACKGROUND ART

It is well known in the art that the performance of metal oxide semiconductor (MOS) devices may be enhanced by forming each individual MOS field effect transistor (FET) in a semiconductor island such as silicon on an insulator substrate so that each MOSFET is isolated from other MOSFET's.

Various substrate materials including sapphire are well known in the art, as set forth in the following patents and publications, the disclosures of which are expressly incorporated herein by reference: U.S. Pat. No. 3,393,088 to Manasevit, et al., U.S. Pat. No. 3,414,434 to Manasevit, U.S. Pat. No. 3,475,209 to Manasevit, U.S. Pat. No. 3,515,576 to Manasevit, U.S. Pat. No. 3,664,866 to Manasevit, U.S. Pat. No. 3,508,962 to Manasevit et al., M. W. Geis, et al., "Crystallographic Orientation of Silicon on an Amorphous Substrate Using an Artificial Surface Relief Grating and Laser Crystallization", Applied Physics Letters, Volume 35 No. 1, pgs. 71–74, (July 1, 1979, T. E. Kamins et al., "A Monolithic Integrated Circuit Fabricated in Laser Annealed Polysilicon", I.E.E.E. Transactions on Electron Devices, Volume Ed. 27, No. 1, (January, 1980), pgs. 290–295.

Fabrication of such silicon on sapphire (SOS) devices is accomplished by growing epitaxial silicon on a sapphire substrate and then etching the silicon to form individual islands on which individual MOSFETS may be fabricated. A significant problem in the art of silicon on sapphire (SOS) is the low channel mobility which results from a high defect density at the top epitaxial silicon surface. Reduction in channel mobility decreases the device operating speed.

Another problem is that aluminum conductors interconnecting between individual MOSFETS on the sapphire substrate must cover a nearly vertical step formed at the edge of each silicon island. A reduction in the thickness of the deposited aluminum conductor and cracks in the aluminum may occur in the vicinity of a vertical step. Such cracks and reduction in the thickness of the deposited aluminum increases the likelihood of discontinuties in the aluminum conductor which cause device failure.

Another problem which is peculiar to SOS devices is that growth of a silicon dioxide layer over the silicon island usually is accompanied by a region of reduced oxide thickness resulting in a "V"-shaped groove at the lower corner of each silicon island edge. If a polycrystalline silicon conductive layer is deposited or grown thereover, the amount of insulation between the overlying polysilicon conductor and the silicon island is greatly reduced at the V-shaped groove, thereby increasing the likelihood of breakdown conduction through the insulating oxide film between the polysilicon conductor and the silicon island.

SUMMARY OF THE INVENTION

All of the foregoing problems are solved in the present invention, in which a beam of radiant energy such as a laser beam is applied to the semiconductor island before formation of the overlying insulating and conducting layers. The energy and power density of the beam improve the quality of the top semiconductor layer, with a concomitant enchancement of channel mobility. Significantly, this in turn leads to an increase in the speed of transistors formed in the semiconductor. Furthermore the exposure to a laser beam can also cause the material in the island edge to reflow, resulting in a reduction in the slope of the island edge. The face of the island edge becomes smoother during this reflow process, so that the roughness of the face is eliminated to provide a smooth and gradually sloping step.

A significant result of the use of this process is that oxide film overlying the island has a uniform thickness even in the vicinity of the bottom edge corner of the island. The uniform thickness of the oxide film provides uniform insulation between an overlying conductor and the island, thereby eliminating the problem of breakdown conduction at the bottom edge corner of the island.

It should be noted that, if high temperature furnace processing were used in an attempt to avoid the foregoing problems, high leakage currents at the semiconductor on insulator interface between the source an the drain of the MOS transistor would occur. Such problems are avoided in this invention by applying a laser beam of sufficiently short wavelength and pulse duration so that the radiation is absorbed within a thin surface layer and over a time period shorter than the characteristic longitudinal thermal transport time of the island. In the preferred embodiment of the invention, the islands are formed of silicon and are exposed to radiation from an excimer laser emitting radiation having a wavelength of 2490 Å, a pulse duration of 25 nanoseconds, a beam size in the range of 0.1 to 0.2 cm$^2$ and an energy density in the range of 0.5 to 1.0 joules/cm$^2$. Alternatively, a pulsed ion beam or electron beam source may be used in a similar fashion. Furthermore, a continuous laser, ion or electron beam source, may be used in which the beam is scanned across the surface of the device.

Following application of the laser beam, the roughness on the edge face of each island has been found to disappear, and the step defined by each island edge has been found to be more gradual. Subsequently, a first oxide layer is grown, followed by deposition and definition of polysilicon conductors, which are then implanted simultaneously with implantation of source and drain regions. Thereafter, a top oxide layer is deposited, contact openings are etched through the oxide layers followed by deposition and definition of aluminum conductors. The resulting step coverage of overlying aluminum conductors was found to be improved, the thickness of the aluminum conductors being uniform throughout the device, thereby solving the problem of discontinuities normally encountered in step coverage by the aluminum layer.

BRIEF DESCRIPTION OF THE DRAWINGS

The invention is best understood by reference to the accompanying drawings of which:

FIG. 1 is a simplified cross sectional view of a silicon-on-sapphire (SOS) island of the prior art over which a MOSFET is to be fabricated;

FIG. 2 is a partial top view of the SOS device of FIG. 1 after deposition of oxide layers and conductors;

FIG. 3 is a cross-sectional view of the silicon island of FIG. 2 taken along lines 3—3 of FIG. 2 and clearly showing the reduced insulation between a polysilicon conductor and the silicon island at the bottom edge corner of the island;

FIG. 4 is a cross-sectional view of the silicon island of FIG. 2 taken along lines 4—4 of FIG. 2 clearly showing the reduced thickness and poor step coverage of an aluminum conductor;

DETAILED DESCRIPTION OF THE INVENTION

Figure 5:
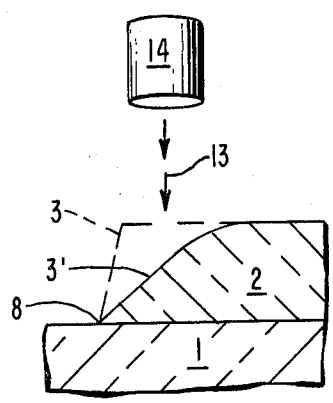
FIG. 5 is simplified cross-sectional view of an SOS island similar to that of FIG. 1, illustrating the application of an energy beam according to the method of the present invention.

FIG. 1 is a simplified cross sectional view of a silicon on sapphire (SOS) island including a sapphire substrate 1 and a silicon island 2 photolithographically defined by an etching process to form an island edge 3. The island edge 3 has a steep slope created during definition of the silicon island 2.

Referring to FIG. 3, a first oxide layer 6 is preferably grown over the top surface of the silicon island 2 and the thickness of the oxide layer 6 is reduced at a bottom edge corner 8 of the island, forming a "V" shaped groove 9. Thereafter, a polysilicon conductor 10 shown in FIGS. 2 and 3 is formed by deposition of polycrystalline silicon followed by photolithographic definition and etching. The deposited polysilicon fills the V-shaped groove 9 so that there is a significant likelihood of breakdown conduction between the polysilicon conductor 10 and the silicon island 2 in the vicinity of the V-shaped groove 9.

The polysilicon conductor 10 is deposited, photolithographically defined and etched. Thereafter, the device is ion implanted to render the polysilicon material conductive while simultaneously forming gate-aligned source and drain diffusions in the silicon island 2, in a manner well-known in the art. A second layer of oxide 11 is then placed over the device. Contacts (not shown) are defined through the oxide layers. An aluminum conductor 12 shown in FIGS. 2 and 4 is formed by evaporation followed by photolithographic definition and etching. Because the etching process which initially defines the edge 3 of the SOS island 2 shown in FIG. 1 is not uniform, the resulting island edge 3 is rough.

FIG. 4 clearly shows that the thickness $t_1$ of the aluminum conductor 12 deposited over the steep island edge 3 is significantly reduced with respect to the aluminum thickness $t_2$ overlying horizontal surfaces. This reduction of the thickness of the aluminum conductor 12 at the edge 3 increases the probability of discontinuities in the conductor 12. As a result, it has been found that the processing yield of metal-oxide-semi-conductor silicon-on-sapphire (MOS/SOS) devices is significantly reduced.

Figure 7:
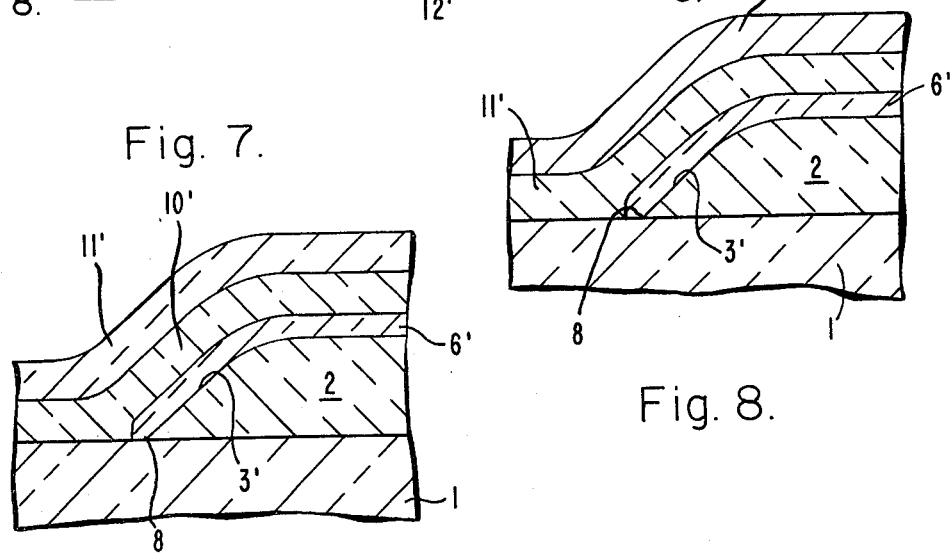
FIG. 7 is a simplified cross-sectional view of the silicon island of FIG. 6 taken along lines 7—7 of FIG. 6 clearly showing the improved insulation between the polysilicon conductor and the silicon island at its bottom edge corner.
Figure 8:
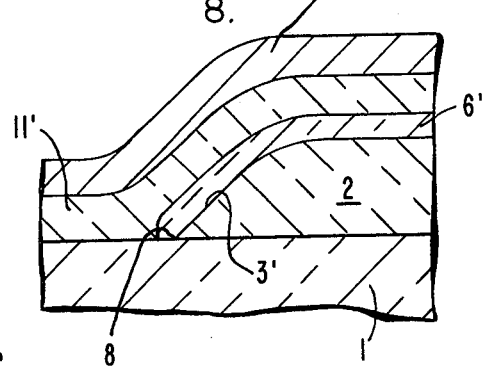
FIG. 8 is a simplified cross-sectional view of the silicon island of FIG. 6 taken along lines 8—8 of FIG. 6 clearly showing the improved step coverage of the aluminum conductor.

The foregoing problems are solved using the method of the present invention illustrated in FIG. 5 by directing a pulsed beam 13 of radiant energy from an energy source 14 such as a laser toward the silicon island 2 prior to the growth or deposition of overlying insulating and conductive layers. The drawing of FIG. 5 is purely schematic and does not imply any restriction on required beam size. The energy beam 13 causes reflow of silicon in the island edge 3, and the result is a re-formed island edge 3' shown in solid line in FIG. 5. Furthermore, the energy beam improves the quality of the crystal structure of the silicon island 2, which increases the channel mobility of metal oxide semiconductor field effect transistors (MOSFET's) fabricated on the silicon island 2. It should be noted that, in order to increase mobility, the energy beam may be applied either before or after definition of the silicon island 2. Mobility in MOS transistors is a well-known concept in the art and is discussed, for example, in Penny, et al., *MOS Integrated Circuits,* Van Nostrand, Reinhold Co., 1972, pages 162–168, the disclosure of which is incorporated by reference. Referring to FIGS. 7 and 8, an oxide layer 6, a polysilicon conductor 10, a second oxide layer 11 and an aluminum conductor 12 are deposited in the manner described in connection with FIGS. 1–4. The reformed island edge 3' has a moderate slope, being oriented at approximately 60° with respect to the top of the sapphire substrate 1.

Referring to FIG. 8, the moderate slope of the island edge 3' permits the deposited aluminum conduction layer 12 to assume a nearly uniform thickness along the island edge, reducing the likelihood of physical discontinuities in the aluminum conductor 12.

Referring to FIG. 7, the likelihood of breakdown conduction at the bottom edge corner 8 between the polysilicon conductor 6 and the silicon island 2 is significantly reduced because the V-shaped groove 9 is eliminated due to the reduced slope of the silicon island edge 3'.

Figure 6:
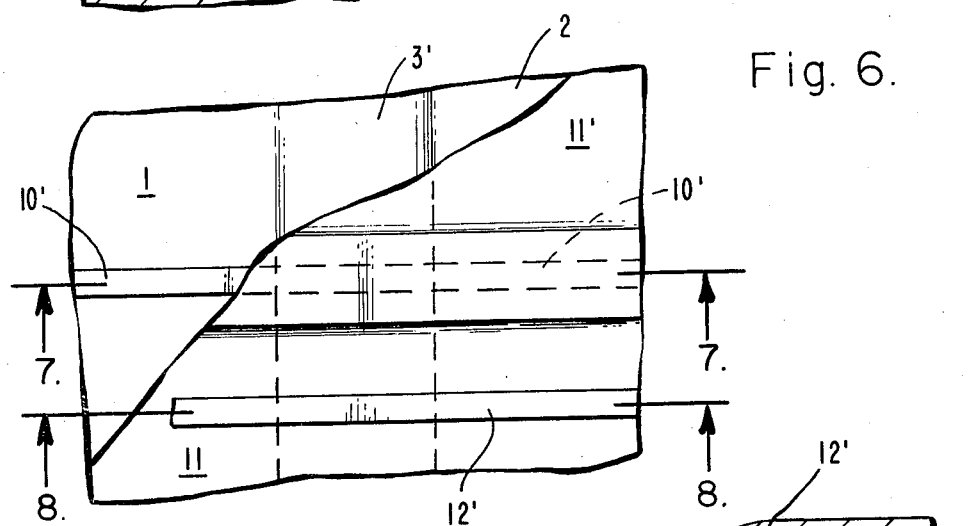
FIG. 6 is a partial top view of the SOS device of FIG. 3 after application of the energy beam and after deposition of overlying oxide and metal layers.

In the preferred method of this invention, the energy beam source 14 of FIG. 5 is a pulsed excimer laser, emitting a beam 13 having a pulse duration of approximately 25 nanoseconds, a wavelength of approximately 2490 Å, and an energy density between 0.5 and 1.0 joule/cm$^2$. However, it should be recognized that the scope of this invention includes the use of any pulsed beam source or continuous scanning beam source, including an electron, ion or laser beam source in accordance with the present method. The method of this invention is applicable to any MOS/SOS structure similar to that of FIGS. 6, 7, and 8 in which the first insulating layer is any suitable dielectric, including grown silicon oxide, chemical vapor deposited silicon dioxide, grown silicon nitride, or grown silicon dioxide with chemical vapor deposited silicon nitride. The first insulating layer 6 may be grown or deposited silicon dioxide $SiO_2$ or silicon nitride ($Si_3N_4$) of the type discussed by Pliskin, "Comparison of Properties of Dielectric Films Deposited by Various Methods", *Journal of Vacuum Science Technology,* Vol. 14, No. 5, September/October 1977, pp. 1064–1081.

The first conductive layer 10 may be any polycrystalline or amorphous material, such as polycrystalline silicon or it may be polycide or metal silicide of the type disclosed in Crowder et al., "1 µm MOSFET VLSI Technology: Part VII Metal Silicide Interconnection Technology—A Future Prospective", *IEFE Trans. on Electron Devices,* Vol. Ed.-26 No. 4, April 1979, Pages 369-371. Alternatively, the conductive layer 10 may also be a refractory metal layer of the type disclosed in Shah, "Refractory Metal Gate Processes for VLSI Applications", *IEEE Trans. on Electron Devices,* Vol. ED-26, No. 4, April 1979, pp. 631-640. The disclosures of the above-identified Crowder, Shah, and Pliskin publications are hereby expressly incorporated herein by reference in their entirety.

In summary, this invention is a unique beam processing technique for improving semiconductor on insulator device performance by improving the crystal structure of the semiconductor islands to increase channel mobility and thereby improve device operating speed. Another improvement is made by causing the semiconductor material in the vicinity of the island edge to reflow in such a way as to decrease the slope of the island edge and to increase smoothness of the island edge. Overlying aluminum conductive layers are of more uniform thickness throughout the device, even in the vicinity of the island edge, advantageously decreasing the probability of discontinuities in the aluminum layer. Finally, improvement of the SOS island edge prevents formation of a V-shape groove in the first oxide layer at the bottom island edge corner, thereby decreasing the probability of breakdown conduction between overlying conductors and the island.

We claim:

1. A method for increasing the channel mobility of transistors formed in epitaxial silicon islands over a sapphire substrate and for achieving improved step coverage by conductors deposited over said islands, comprising:

forming a layer of epitaxial silicon over a sapphire substrate;
   defining a plurality of epitaxial silicon islands in said silicon layer;
   exposing said islands to a beam of energy of sufficient magnitude;
   placing a first insulating layer over said silicon islands;
   placing and defining a polycrystalline conductor over said first insulating layer;
   ion implanting said silicon islands and said polycrystalline conductor;
   placing a second insulating layer over said conductor and said first insulating layer;
   opening contacts through said second insulating layer; and,
   placing and defining a metal conductor over said second insulating layer.

2. The method of claim 1 wherein said second placing step comprises depositing a layer of polycrystalline silicon.

3. The method of claim 1 wherein said second placing step comprises depositing a layer of polycide.

4. The method of claim 1 wherein said second placing step comprises depositing a layer of metal silicide.

5. The method of claim 1 wherein said second placing step comprises depositing a refractory metal layer.

6. The method of claim 1 wherein said first placing step comprises depositing a layer of silicon dioxide.

7. The method of claim 1 wherein said first placing step comprises growing a layer of silicon dioxide.

8. The method of claim 1 wherein said first placing step comprises depositing a layer of silicon nitride.

9. The method of claim 1 wherein said first placing step comprises growing a layer of silicon dioxide and depositing a layer of silicon nitride.

10. The method of claim 1 wherein said fourth placing step comprises depositing an aluminum layer.

11. The method of claim 1 wherein said exposing step comprises directing a pulsed electron beam source at said silicon island.

12. The method of claim 1 wherein said exposing step comprises directing a continuous electron beam source at said silicon island and scanning the beam across said silicon island.

13. The method of claim 1 wherein said exposing step comprises directing a pulsed ion beam source at said silicon island.

14. The method of claim 1 wherein said exposing step comprises directing a continuous ion beam source at said silicon island and scanning the beam across said silicon island.

15. The method of claim 1 wherein said exposing step comprises scanning a continuous laser beam across said silicon island.

16. The method of claim 1 wherein said exposing step comprises directing a pulsed laser beam.

17. A method for forming metal oxide semiconductor transistors having improved mobility in epitaxial silicon islands over a sapphire substrate comprising:

(a) placing a layer of epitaxial silicon over a sapphire substrate;
   (b) defining a plurality of silicon islands in said silicon layer;
   (c) exposing said silicon islands to a beam of energy; and,
   (d) forming metal oxide semiconductor transistor source and drain regions in said islands.

18. The method of claim 17 wherein step (c) precedes step (b).

19. The method of claim 17 wherein step (c) is performed after step (b).

20. In a metal oxide semiconductor silicon-on-sapphire device having a plurality of silicon islands, a method for improving metal step coverage by a metal layer and for preventing breakdown conduction between an insulated conductive layer and the silicon islands, comprising:

(a) forming a plurality of silicon islands on a sapphire substrate to define an island edge surrounding each of said silicon islands;
   (b) exposing said silicon islands to a beam of energy of sufficient magnitude to cause the silicon material in the vicinity of said island edge to reflow so to reduce the slope and smooth the surface of said edges;
   (c) placing a first insulation layer over said silicon island;
   (d) placing a first conductive layer over said first insulation layer and defining a conductive gate therein;
   (e) ion implanting said conductive gate and said silicon islands;
   (f) placing a second insulating layer over said conductive gate and over said first insulation layer;
   (g) opening contacts in said second insulating layer; and, (h) placing a metal layer over said second insulating layer and defining a metal conductor therein.

21. The method of claim 20 wherein said third placing step comprises placing a layer of silicon dioxide.

22. The method of claim 20 wherein said first placing step comprises growing a layer of silicon dioxide.

23. The method of claim 20 wherein said first placing step comprises depositing a layer of silicon dioxide by chemical vapor deposition.

24. The method of claim 20 wherein said first placing step comprises growing silicon nitride.

25. The method of claim 20 wherein said first placing step comprises:
   (a) growing silicon dioxide; and
   (b) depositing silicon nitride by chemical vapor deposition.

26. A method for increasing carrier mobility in epitaxial semi-conductive material comprising exposing the epitaxial material to a beam of radiant energy.

27. The method of claim 26 wherein said exposing step comprises directing a laser beam at said epitaxial material.

28. A method for increasing the channel mobility of transistors formed on epitaxial silicon islands over a sapphire substrate comprising exposing said epitaxial silicon to an energy beam.

29. The method of claim 28 further comprising photolithographically defining said silicon islands.

30. The method of claim 29 wherein said exposing step precedes said defining step.

31. The method of claim 30 wherein said defining step precedes said exposing step.

* * * * *